(12) United States Patent
Tel et al.

(10) Patent No.: US 7,511,799 B2
(45) Date of Patent: Mar. 31, 2009

(54) LITHOGRAPHIC PROJECTION APPARATUS AND A DEVICE MANUFACTURING METHOD

(75) Inventors: Wim Tjibbo Tel, Helmond (NL); Johannes Wilhelmus De Klerk, Eindhoven (NL); Peter Hanzen Wardenier, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 400 days.

(21) Appl. No.: 11/340,842

(22) Filed: Jan. 27, 2006

(65) Prior Publication Data

US 2007/0177123 A1    Aug. 2, 2007

(51) Int. Cl.
*G03B 27/72*    (2006.01)
*G03B 27/54*    (2006.01)

(52) U.S. Cl. .......................................... 355/71; 355/67
(58) Field of Classification Search ................. 430/313; 702/117; 355/71, 65, 53
See application file for complete search history.

(56) References Cited

U.S. PATENT DOCUMENTS 5,712,698 A * 1/1998 Poschenrieder et al. ....... 355/71
6,603,530 B1    8/2003 Kohno
2004/0197672 A1 * 10/2004 Weed et al. .................... 430/5
2005/0075819 A1 *  4/2005 Paxton et al. ............... 702/117
2005/0221233 A1 * 10/2005 Minvielle et al. ........... 430/313

FOREIGN PATENT DOCUMENTS

WO    2005/022614 A1    3/2005

* cited by examiner

*Primary Examiner*—Alan A Mathews
*Assistant Examiner*—Danell L Owens
(74) *Attorney, Agent, or Firm*—Pillsbury Winthrop Shaw Pittman LLP

(57) ABSTRACT

A lithographic apparatus wherein a dipole illumination mode used for printing a line pattern, is arranged to provide quadrupole illumination. Radiation emanating from the two additional poles and passing the mask pattern without being affected by diffraction is prevented from reaching the wafer by a radiation blocking aperture disposed in the projection system. Astigmatism aberration due to lens heating associated with the dipole illumination mode is reduced by lens heating associated with the additional poles of the quadrupole illumination mode.

11 Claims, 6 Drawing Sheets

LITHOGRAPHIC PROJECTION APPARATUS AND A DEVICE MANUFACTURING METHOD

BACKGROUND OF THE INVENTION

1. Field of the Invention

This invention relates to a lithographic projection apparatus and a method for manufacturing a device using a lithographic projection apparatus.

2. Description of Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of one or several dies) on a substrate (e.g. a silicon wafer). The lithographic apparatus comprises an illumination system to illuminate the mask and a projection system (also referred to as a projection lens) to transfer the pattern, via imaging, onto a layer of radiation-sensitive material (resist) provided on the substrate. In general, a single substrate will contain a network of adjacent target portions that are successively patterned.

Known lithographic apparatus include so-called steppers or step-and-repeat apparatus, and so-called scanners or step-and-scan apparatus. In a stepper, each target portion is irradiated by exposing an entire pattern onto the target portion at one time, and the wafer is moved by a predetermined amount to a next position for a next exposure. In a scanner, each target portion is irradiated by scanning the pattern through a radiation beam in a given direction (the "scanning" direction) while synchronously scanning the substrate parallel or anti-parallel to this direction, and next the wafer is moved to a next position for a next exposure.

With a scanner, a mask-area irradiated by the illumination system is typically a slit shaped rectangular or elliptical area, whereby in the non-scanning direction the size of the irradiated mask area corresponds to a maximum object field size of the projection lens. In such a scanning exposure apparatus, since the exposure region has a rectangular or slit-like shape, lens elements of the projection optical system may be irradiated in areas of a substantially rectangular or elliptical shape. At a lens element, the footprint of the radiation traversing the projection system is determined by the location where the lens element is disposed in the optical path. In particular, lens elements placed away from a pupil plane of the projection lens are subjected to irradiation in an asymmetric, elongated area.

Due to residual absorption of projection beam radiation in the optical elements and their surface coatings, lens heating is induced during one or more exposures and such a heating may cause rotationally asymmetric deformation of projection lens elements and produce a rotationally asymmetric optical aberration. For example, the optical aberration may include a beyond-tolerance amount of third and higher order astigmatism, whereby the position of best focus for a line-shaped feature of the pattern may become dependent on the orientation of the line. Astigmatism may severely degrade a device pattern image.

A technique for alleviating the induced aberration effect of asymmetric lens heating due to the slit shape of the irradiated mask area is to provide additional radiation beams of non-actinic wavelength to the projection lens so that the lens heating is more uniform. An alternative technique is to define a desired illumination mode (i.e., the effective intensity distribution in the illumination system pupil) by means of different, crossed linear polarizers, one polarizer being disposed in the illumination system and the other (crossed) polarizer being disposed in the projection system. Lens elements upstream of the polarizer in the projection system are then irradiated more uniformly compared to an arrangement where the illumination mode is defined entirely in a pupil of the illumination system.

SUMMARY OF THE INVENTION

It is an object of the present invention to alleviate the problem of astigmatism aberration due to lens heating.

According to an aspect of the invention, there is provided a lithographic projection apparatus that includes an illumination system and a projection system. The illumination system may be configured to illuminate a mask pattern with radiation from an intensity distribution in a pupil having a first and second set of pole pairs disposed in a corresponding first and second set of opposite quadrants defined by two axes intersecting each other in the center of the pupil. Each pole can have enhanced intensity with respect to an intensity in an area surrounding the pole. The projection system may be configured to project an image of the mask pattern, formed by diffracted beams produced from the pattern by radiation from the intensity distribution, onto a photoresist layer coated on a substrate. The projection system may include an aperture device arranged to transmit zeroth order diffracted beams associated with the first set of poles, and to block zeroth order diffracted beams associated with the second set of poles.

According to a further aspect of the invention, there is provided a device manufacturing method of using a lithographic projection apparatus to expose a substrate. The method includes illuminating a mask pattern with radiation from an intensity distribution in a pupil having a first and second set of pole pairs disposed in a corresponding first and second set of opposite quadrants defined by two axes intersecting each other in the center of the pupil. Each pole can have enhanced intensity with respect to an intensity in an area surrounding the pole. The method further includes projecting an image of the mask pattern onto a photoresist layer coated on a substrate. The image can be formed by diffracted beams produced from the pattern by radiation from the intensity distribution. This act of projecting an image can include transmitting zeroth order diffracted beams associated with the first set of poles and blocking zeroth order diffracted beams associated with the second set of poles.

BRIEF DESCRIPTION OF THE DRAWINGS

Embodiments of the invention will now be described, by way of example only, with reference to the accompanying schematic drawings in which corresponding reference symbols indicate corresponding parts, and in which.

DESCRIPTION OF PREFERRED EMBODIMENTS

Figures 1A, 1B, 1C:
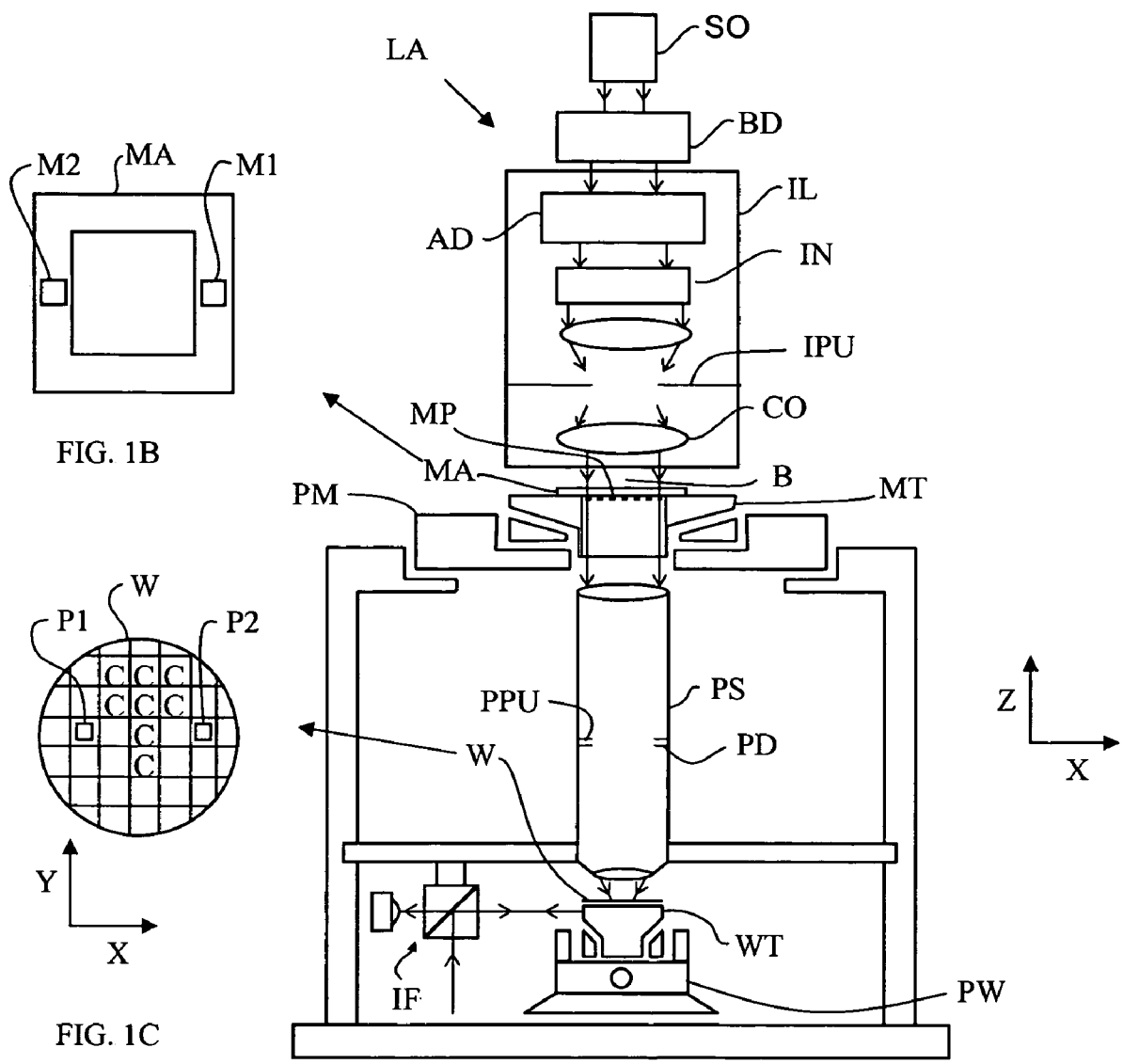
FIG. 1A depicts a lithographic apparatus according to an embodiment of the invention.
FIG. 1B is a plan view of a patterning device shown in the lithographic apparatus of FIG. 1A, according to an embodiment of the invention.
FIG. 1C is a plan view of a substrate shown in the lithographic apparatus of FIG. 1B, according to an embodiment of the invention.

FIGS. 1A, 1B and 1C depict a lithographic apparatus LA, a patterning device MA, and a substrate W, according to a first embodiment of the invention. The apparatus LA of FIG. 1A includes an illumination system IL, a support structure (e.g., a mask table) MT, a substrate table (e.g., a wafer table) WT, and a projection system (e.g., a refractive projection lens system) PS.

The illumination system IL is configured to condition a radiation beam B (e.g., a beam of UV radiation as provided by a mercury arc lamp, or a beam of DUV radiation generated by a KrF excimer laser or an ArF excimer laser). The support structure (e.g., a mask table) MT is constructed to support the patterning device (e.g., a mask) MA having a mask pattern MP and connected to a first positioner PM. The first positioner PM can be configured to accurately position the patterning device in accordance with certain parameters.

The substrate table (e.g., a wafer table) WT is constructed to hold a substrate (e.g., a resist-coated wafer) W and is connected to a second positioner PW. The second positioner PW can be configured to accurately position the substrate in accordance with certain parameters.

The projection system (e.g., a refractive projection lens system) PS is configured to project a pattern imparted to the radiation beam B by the pattern MP of the patterning device MA onto a target portion C of the substrate W. The target portion, for example, may include one or more dies.

The illumination system may include various types of optical components, such as refractive, reflective, and diffractive types of optical components, or any combination thereof, for directing, shaping, or controlling radiation.

The support structure MT supports (i.e., bears the weight of) the patterning device MA. It holds the patterning device MA in a manner that depends on the orientation of the patterning device MA, the design of the lithographic apparatus, and other conditions, such as for example whether or not the patterning device MA is held in a vacuum environment. The support structure MT may be a frame or a table, for example, which may be fixed or movable as required. The support structure MT may ensure that the patterning device MA is at a desired position, for example, with respect to the projection system PS. Any use of the terms "reticle" or "mask" herein may be considered synonymous with the more general term "patterning device."

The term "patterning device," as used herein, should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. That, for example, may occur if the pattern MP includes phase-shifting features or so-called "assist" features. Generally, the pattern imparted to the radiation beam B will correspond to a particular functional layer in a device being created in the target portion, such as an integrated circuit.

The patterning device MA may be transmissive or reflective. Examples of patterning devices MA include masks, programmable mirror arrays, and programmable LCD panels. Masks are well known in lithography and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, and catadioptric optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual-stage) or more substrate tables (and/or two or more mask tables). In such "multiple stage" machines, the additional tables may be used in parallel, or preparatory steps may be ]carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. Immersion techniques are well known in the art for increasing the numerical aperture of projection systems. The term "immersion" as used herein does not necessarily mean that a structure, such as a substrate, must be submerged in liquid, but rather only means that liquid is located between the projection system and the substrate during exposure.

Referring to FIG. 1A, the illumination system IL receives a radiation beam from a radiation source SO, such as, for example, a mercury-arc lamp for providing g-line or i-line UV radiation, or an excimer laser for providing DUV radiation of a wavelength of less than about 270 nm, such as, for example, 248, 193, 157, and 126 nm. The source SO and the lithographic apparatus may be separate entities. An example can include situations where the source SO is an excimer laser. In such cases, the radiation beam B is passed from the source SO to the illumination system IL with the aid of a beam delivery system BD. The beam delivery system BD can include, for example, suitable directing mirrors and/or a beam expander. In other cases, the source may be an integral part of the lithographic apparatus. Examples of integral parts can include, for example, situations when the source SO is a mercury lamp. The source SO and the illumination system IL, together with the beam delivery system BD if required, may be referred to as a radiation system.

The illumination system IL may comprise an adjuster AD for adjusting the angular intensity distribution of the radiation beam at mask level. Generally, at least the outer and/or inner radial extent (commonly referred to as σ-outer and σ-inner, respectively) of the intensity distribution in a pupil IPU of the illumination system can be adjusted. In addition, the illumination system IL may include various other components, such as an integrator IN and a condenser CO. The illumination system may be used to condition the radiation beam B to have a desired uniformity and intensity distribution in its cross-section at mask level.

The radiation beam B is incident on the patterning device (e.g., mask) MA, which is held on the support structure (e.g., mask table) MT, and is patterned by the patterning device MA in accordance with a pattern MP. Having traversed the patterning device (or mask) MA, the radiation beam B passes through the projection system PS, which focuses the beam B onto a target portion C of the substrate W.

The projection system has a pupil PPU conjugate to the illumination system pupil IPU, where portions of radiation emanating from the intensity distribution at the illumination system pupil IPU and traversing a mask pattern without being affected by diffraction at a mask pattern, create an image of the intensity distribution at the illumination system pupil IPU.

With the aid of the second positioner PW and position sensor IF (e.g. an interferometric device, linear encoder or capacitive sensor), the substrate table WT can be moved accurately. These movements can be performed, for example, so as to position different target portions C in the path of the radiation beam B. Similarly, the first positioner PM and another position sensor (which is not explicitly depicted in FIG. 1A) can be used to accurately position the patterning device MA (or mask) with respect to the path of the radiation beam B. This accurate positioning can be performed, for example, after mechanical retrieval from a mask library or during a scan. In general, movement of the support structure (or mask table) MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner), the support structure (or mask table) MT may be connected to a short-stroke actuator only, or may be fixed. The patterning device (or mask) MA and substrate W may be aligned using mask alignment marks M1, M2 and substrate alignment marks P1, P2. Although the illustrated substrate alignment marks occupy dedicated target portions, they may be located in spaces between target portions (these are known as scribe-lane alignment marks). Similarly, in situations in which more than one die is provided on the patterning device (or mask) MA, the mask alignment marks M1, M2 may be located between the dies.

The depicted apparatus could be used in at least one of the following modes: 1) step mode, or 2) scan mode.

In step mode, the support structure (or mask table) MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

In scan mode, the support structure (or mask table) MT and the substrate table WT are scanned synchronously while a pattern imparted to the radiation beam B is projected onto a target portion C (i.e., a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In another mode, the mask table MT is kept essentially stationary holding a programmable patterning device, and the substrate table WT is moved or scanned while a pattern imparted to the radiation beam B is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

Figure 2:
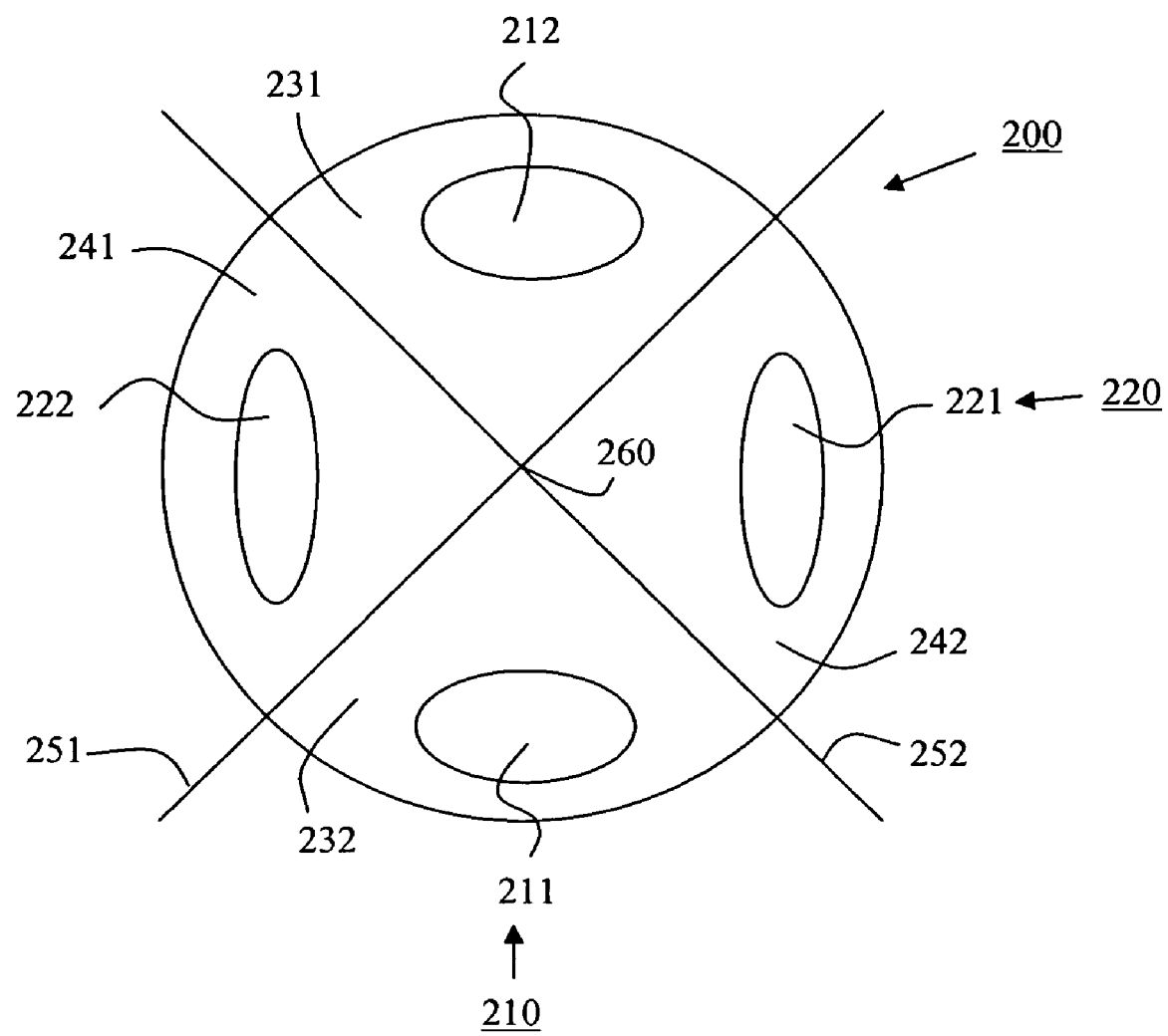
FIG. 2 illustrates an intensity distribution in a pupil plane of an illumination system.

According the present invention, and as illustrated in FIG. 2, the illumination system IL is configured to illuminate the mask pattern MP with radiation emanating from an intensity distribution 200, in the pupil IPU. The intensity distribution 200 has a first set 210 of two poles 211 and 212 disposed in a corresponding first set of opposite quadrants 231 and 232, and second set 220 of two poles 221 and 222 disposed in a corresponding second set of opposite quadrants 241 and 242 defined by two axes 251 and 252 intersecting each other in the center 260 of the pupil IPU. Each pole 211, 212, 221, 222 has enhanced intensity with respect to an intensity in an area surrounding the poles 211, 212, 221, 222.

Figure 3:
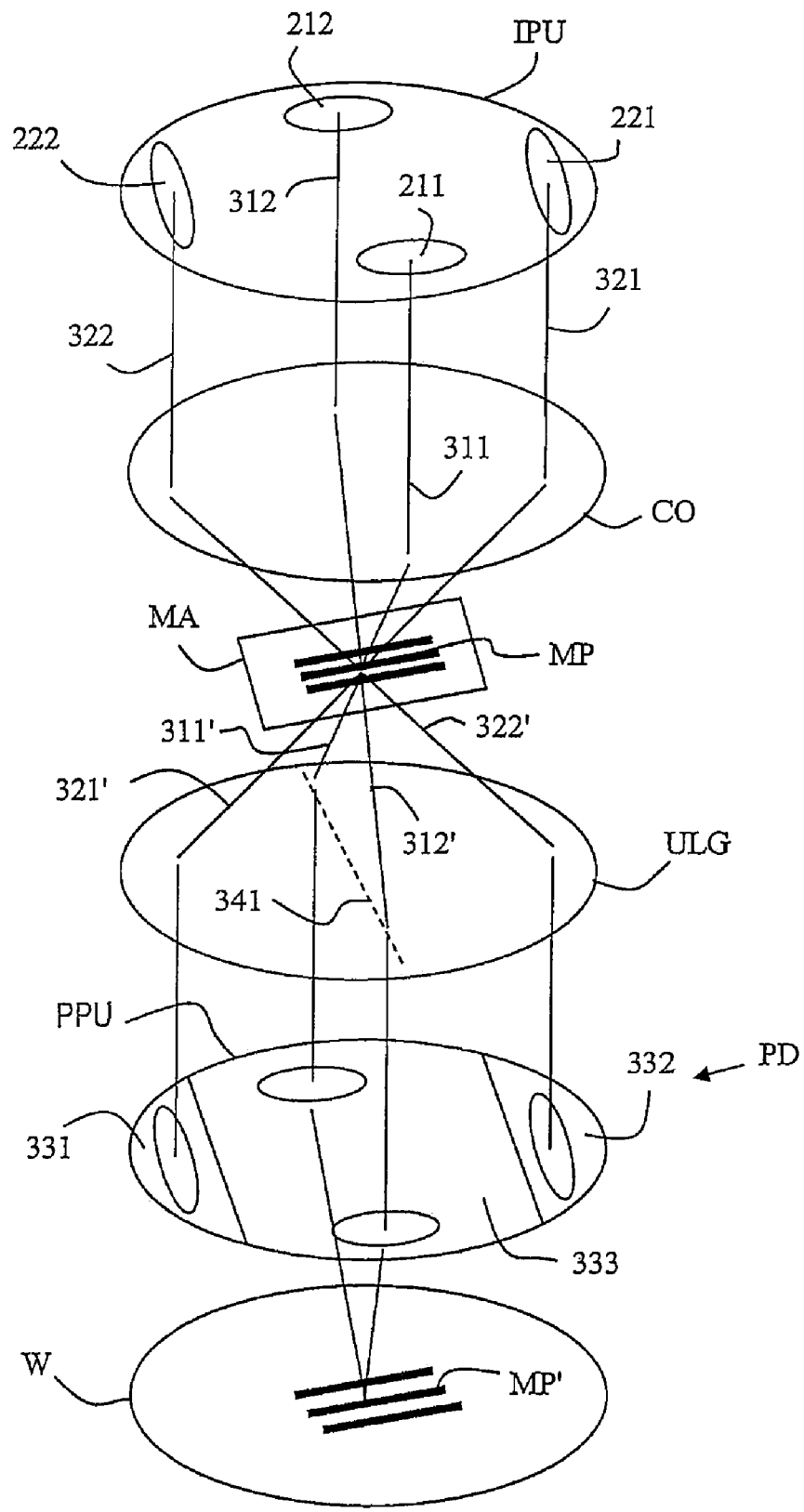
FIG. 3 depicts selected transmitted and selected blocked portions of radiation emanating from an intensity distribution in an illumination system pupil and traversing a mask pattern without being affected by diffraction at a mask pattern.

As illustrated schematically in FIG. 3, the projection system PS (shown in FIG. 1A) projects an image MP' of the mask pattern MP, which image MP' is formed by diffracted beams produced from the pattern MP by radiation from the intensity distribution, onto a photoresist layer coated on the substrate W. Beams 311, 312, 321 and 322 emanate from the poles 211, 212, 221 and 222, respectively. These beams traverse the condenser CO and illuminate a patterning device (or mask) MA provided with a pattern MP.

The pattern MP, in the present embodiment, includes an array of lines and spaces. A diffraction of radiation at the array and different from zeroth order diffraction generates diverted diffracted beams with a change of direction in a direction perpendicular to the lines. Undiffracted beams (i.e., so-called zeroth order diffracted beams) traverse the pattern without any change in propagation direction. The beams 311', 312', 321', and 322' are such zeroth order diffracted beams associated with the beams 311, 312, 321 and 322 respectively.

The zeroth order diffracted beams traverse an upper lens group ULG of the projection system PS, upstream of the pupil PPU of the projection system PS, to reach the pupil PPU. The portion of the intensity distribution in the plane of the pupil PPU and associated with the zeroth order diffracted beams is an image of the intensity distribution in the pupil IPU of the illumination system.

According to the present invention, and as illustrated in FIG. 3, the projection system PS comprises an aperture device PD arranged to block zeroth order diffracted beams 321' and 322' associated with the second set of poles 221 and 222.

The aperture device PD may be a diaphragm embodied as a metal plate with radiation obstructing areas 331 and 332, and with an unobstructed area 333 for passing the zeroth order diffracted beams 311' and 312' associated with the first set of poles 211 and 212. Alternatively, the aperture device PD may be embodied as a transmissive substrate or optical element or optical lens element, whereby the areas 331 and 332 for obstructing radiation are embodied as radiation absorbing areas. For example, a radiation absorbing coating (such as a chrome coating) may be provided on a surface of the substrate or elements within such areas. Alternatively, the aperture device PD may be embodied as a diffractive element or reflective element, whereby radiation irradiating the areas 331 and 332 is effectively blocked in the sense that it is diffracted or reflected away from the optical path. According to an aspect of the invention, the aperture device PD is disposed at or substantially at a plane that includes the pupil PPU of the projection system PS.

The projection system PS is arranged to capture, by means of the upper lens group ULG, not only the zeroth order diffracted beams from the four poles in the illumination pupil IPU, but also first-order or first- and higher-order diffracted beams (not shown in FIG. 3) associated with the poles 211 and 212. The latter poles 211, 212 represent a dipole illumination mode which is a preferable illumination mode for imaging line patterns extending in a direction perpendicular to a line connecting the two poles 211, 212. In particular, first-order diffracted beams interfere with corresponding zeroth-order diffracted beams at the level of the wafer W to create an image MP' of the line pattern MP at highest possible resolution and process window (i.e., usable depth of focus in combination with tolerable exposure dose deviations). As a result of such blocking, the beams 321' and 322' are prevented from reaching the wafer W, thereby maintaining the resolution enhancement effect of conventional dipole illumination. This represents an enhancement over arrangements in which the beams 321' and 322' cause, when irradiating a target portion C on the wafer, a loss of contrast of the image MP'.

In the absence of the beams 321' and 322', the heating of lenses in the upper lens group ULG and of lenses (not shown in FIG. 3) near the pupil PPU of the projection system PS, due to radiation absorption, is mainly concentrated along lines connecting the areas where the zeroth-order beams 311' and 312' traverse the optical elements, a schematic example of such a line being line 341 in FIG. 3. This leads to a corresponding asymmetric expansion and deformation of lens elements, which in turn results in astigmatism aberration.

According to the present invention, the astigmatism aberration can be reduced by the presence of radiation beams 321' and 322' traversing the upper lens group ULG and lenses near (and upstream of) the aperture device PD, disposed at the pupil PPU of the projection system PS, so that a further residual absorption of radiation leads to an additional heating of any such upstream lens elements symmetrically along a line perpendicular to lines 341 (i.e., symmetric along a line connecting the areas where the zeroth order beams 321' and 322' traverse the upstream optical elements). A resulting deformation of lens elements complements the deformation caused by the radiation beams associated with the dipole illumination mode used for the conventional imaging and does so in a manner which counteracts astigmatism aberration.

A known source of astigmatism aberration error typical for scanners is related to the shape of the area illuminated at the patterning device (or reticle) MA. With a scanner, a mask-area irradiated by the illumination system is, for example, a slit-shaped rectangular area, whereby the slit extends in a direction perpendicular to the scanning direction. Therefore, a footprint of the radiation at surfaces of lenses of the upper lens group ULG in FIG. 3 which are adjacent to the patterning device (or mask) MA is substantially slit-shaped as well.

At intermediate positions (between the patterning device or mask MA and the pupil PPU) along the optical axis of the projection system PS, the footprint is substantially a convolution of the slit-shaped intensity distribution and a scaled or unscaled version of the illumination pupil intensity distribution, whereas near and at the pupil of the projection system PS, the footprint is an image of the intensity distribution in the pupil IPU of the illumination system (scaled by a pupil-to-pupil magnification). According to an aspect of the present invention, astigmatism aberration can be reduced by providing radiation poles 221, 222 in opposite quadrants of the illumination system pupil IPU and on a line perpendicular to a direction of elongation of the slit shape or of the convoluted slit shape, and by blocking the zeroth order beams in the pupil PPU of the projection system PS associated with these poles 221, 222.

A conventional technique for alleviating the induced aberration effect of asymmetric lens heating due to the slit shape of the irradiated mask area is to provide additional radiation beams of non-actinic wavelength to the projection lens elements in areas which are not irradiated by the image-forming projection beam of radiation at an actinic wavelength. A photo-active substance of the resist layer on a wafer is not sensitive to the non-actinic wavelength radiation. The presence of this radiation therefore does not degrade a device pattern image. A fraction of the non-actinic radiation is absorbed in the optical elements, and the resulting heating spatially complements the lens heating due to the conventional image forming projection radiation. To achieve this, however, one or more additional non-actinic radiation sources must be incorporated in the projection apparatus. In contrast, with a lithographic apparatus and method according to the present invention, the use of additional radiation sources and related optical systems can be avoided, leading to a reduction of costs.

Another conventional technique is to provide uniformly distributed (actinic) radiation to the optical elements of the projection system, and to define the illumination mode (i.e., an effective intensity distribution in the illumination system pupil) by means of a first linear polarizing element disposed in a pupil IPU of the illumination system with open, non polarizing areas defining, for example, a quadrupole illumination mode, and a second linear polarizing element disposed in the pupil PPU of the projection system PS. The first polarizer effectuates linear polarization of the radiation in areas complementary to the open, non-polarizing dipole areas defining the illumination mode. Just downstream of the first polarizing element, the intensity distribution is therefore less non-uniform compared to a hard quadrupole illumination mode. The second polarizing element has, in use, openings conjugate to the open areas of the first polarizing element, and its axis of polarization is arranged in crossed orientation with respect to the first polarizer. Consequently, the lens elements upstream of the second polarizer are irradiated more uniformly compared to an arrangement whereby quadrupole illumination is defined by, for example a metal blade with four openings in the illumination system pupil. The more uniform illumination reduces asymmetric aberration. In this technique, there is a need to use circular or unpolarized source radiation. The present invention imposes no limitation on the state of polarization of the illumination radiation, so that contrast enhancement techniques based on polarization selection and control can be used with an apparatus or method according to the present invention.

In another conventional approach a conventional single exposure for pattern transfer is preceded by a thermal conditioning exposure using the same lithographic apparatus. Thereby a dedicated "pre exposure" thermal conditioning pattern is exposed, and this pattern is arranged to provide radiation incident on the projection optical system such that at least one lens of the projection optical system is substantially thermally saturated. The pre-exposure pattern may either generate rotationally symmetric radiation footprints on the optical elements or generate rotationally asymmetric footprints complementary to the footprint of the projection beam. In this technique, the pre-exposure step results in a lower process throughput compared to the method of the present invention (which does not necessarily involve a pre-exposure step).

Figure 4:
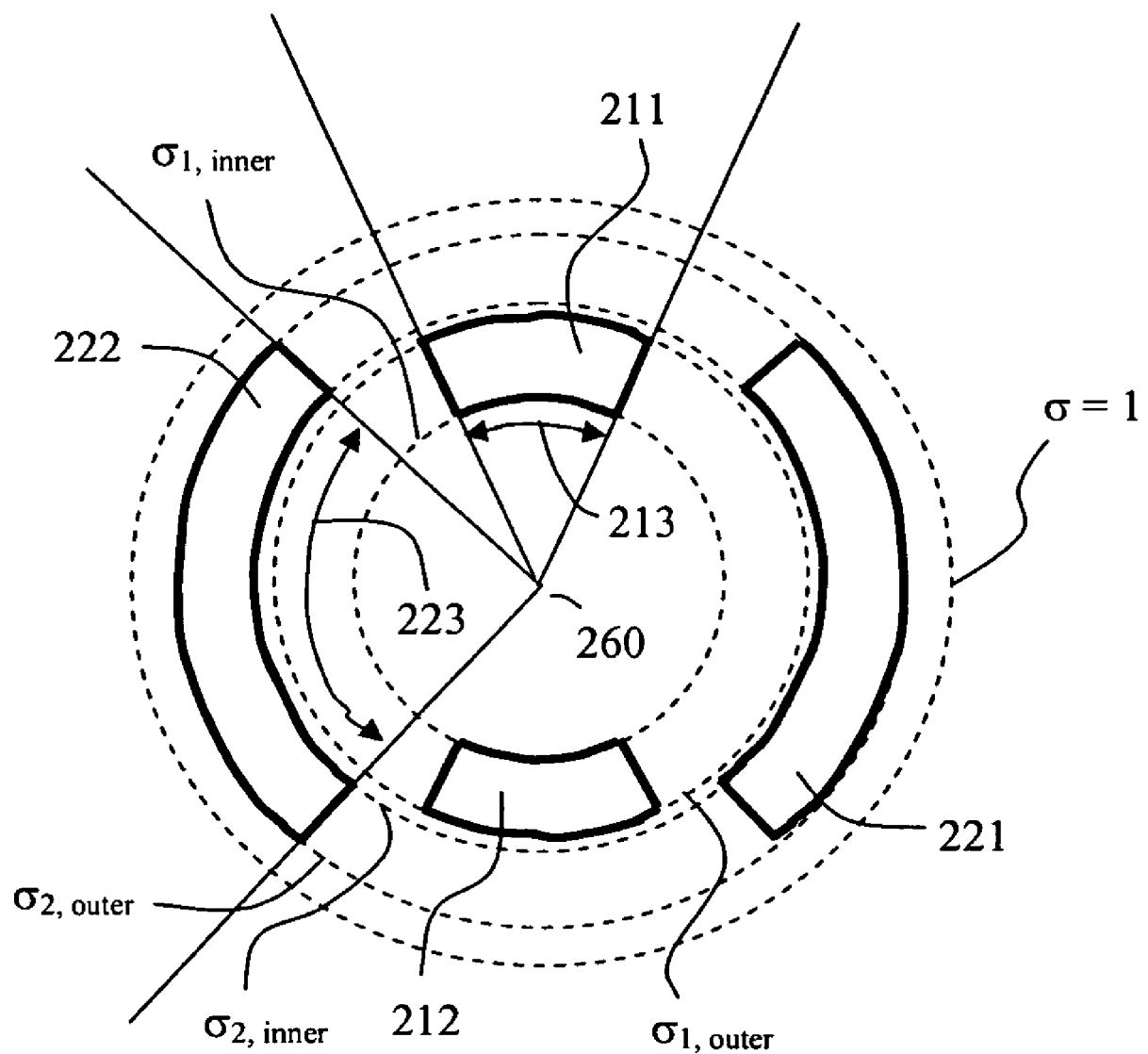
FIG. 4 illustrates an example of an intensity distribution in a pupil plane of an illumination system according to the present invention.

An example of the present embodiment is illustrated in FIG. 4 and described in the following paragraphs. A lithographic dense line printing process is arranged to be executed with a dipole illumination mode on a lithographic projection apparatus. The lithographic projection apparatus is provided with a projection system featuring a maximum selectable numerical aperture of 0.93, denoted here as $NA_{max}$=0.93. The source SO of radiation is an ArF excimer laser emitting laser radiation at a wavelength of 193 nm.

The dipole illumination mode is characterized by the normalized radial extent of the poles (211, 212). An X,Y-coordinate system may be defined on two perpendicular axes in the pupil of the illumination system, with an origin at the center of the pupil, and supporting a polar coordinate system $\sigma,\theta$ wherein $\sigma$ is a radial distance and $\theta$ is an azimuth angle. The $\sigma$ coordinate is a normalized coordinate, i.e., the radius of the illumination system pupil is 1, as shown in FIG. 4, and this radius corresponds to the numerical aperture $NA_{max}$. The radial extent of the poles 211 and 212 is given by the $\sigma$-values $\sigma_{1,\ inner}$ and $\sigma_{1,\ outer}$, as illustrated in FIG. 4. For the present example $\sigma_{1,\ inner}$=0.59 and $\sigma_{1,\ outer}$=0.81. The angular extent ($\theta$-extent) of the poles 211,212 is shown by the arrow 213 in FIG. 4, and is 35 degrees.

A dipole illumination mode as described here can be provided by using, for example, an aperture blade with dipole openings placed in the illumination system pupil. However, avoiding the use of radiation obstructing blades for this purpose, a Diffractive Optical Elements (DOE) can be arranged to diffract the laser beam at an exit plane of the beam delivery system BD in FIG. 1A into two beams with two different propagation directions. In an optical Fourier Transform plane, such as for example, the plane comprising the pupil IPU in FIG. 1A, these different directions correspond to the desired dipole intensity distribution.

The printing process is aimed at printing dense lines at a critical dimension of 70 nm line width, whereby the mask in use is a 6% transmissive attenuated phase shift mask. The orientation of the dipole illumination mode is arranged such that a line connecting the poles in the illumination system pupil has a direction perpendicular to the direction of the desired printed lines. The setting of the numerical aperture of the projection system is chosen in accordance with a pitch of the line pattern. In the present example, the pitch is 140 nm. For the process of printing such dense lines, there is selected a numerical aperture, denoted by $NA_{sel}$, of 0.85, corresponding to $\sigma$=0.91 (not shown in FIG. 4) at $NA_{max}$=0.93.

The projection system PS comprises an aperture device PD embodied as an adjustable iris-diaphragm in a plane of the pupil PPU of the projection system PS. The clear aperture of the diaphragm can be varied to select a desired numerical aperture $NA_{sel}$. Lines at other directions than the direction of the critical lines, which may be present in the periphery of the line pattern MP, may be printed with this same illumination mode, but with these lines the problem of printed pattern errors due to astigmatism wave front aberration will be present.

In accordance with the present invention, to alleviate the effect of astigmatism aberration due to lens heating, the conventional printing process is modified by adding to the two poles 211 and 212 of the dipole illumination mode a second set of poles 221 and 222. The second set of poles 221 and 222 are referred to hereinafter as the "assist-poles" 221 and 222. The assist poles 221 and 222 are located in quadrants complementary to quadrants comprising the poles 211 and 212 of the conventional dipole illumination mode. The latter poles 211, 212 may also be referred to, hereinafter, as the first set of poles. The radial extent $\sigma_{2,\ inner}$ and $\sigma_{2,\ outer}$, as illustrated in FIG. 4, of the assist poles 221 and 222 is chosen such that a minimum radial extent $\sigma_{2,\ inner}$ of the assist poles is larger than or equal to the maximum radial extent $\sigma_{1,\ outer}$ of the conventional poles 211, 212 of the dipole illumination mode. In the present example of the first embodiment, the assist poles 221, 222 are characterized by the $\sigma$-values $\sigma_{2,\ inner}$=0.914 and $\sigma_{2,\ outer}$=0.98. Since the $\sigma$-value of the selected numerical aperture $NA_{sel}$ is smaller than the minimum radial extent $\sigma_{2,\ inner}$ of the assist poles, the zeroth order diffracted radiation associated with the assist poles 221 and 222 is blocked by portions of the adjustable iris diaphragm protruding in the optical path provided by the projection system PS.

In the lithographic printing process of the present example, the imaging conditions in the resist layer combined with apparatus parameters affecting the process window are such that ideally an exposure dose of 20 mJ/cm2 is required. Here, for the conventional printing process, the output power of the ArF excimer laser is not a limiting factor. Indeed, the source is capable of operating at an output power whereby a roughly twice as high exposure dose is obtained.

According to an aspect of the present invention, the assist poles 221 and 222 are shaped and dimensioned such that the excess power of the source SO is exploited for providing radiation energy into the beams 321' and 322' (shown in FIG. 3) associated with the assist poles 221 and 222. The ideal exposure dose of 20 mJ/cm2 corresponds to an equivalent target integrated intensity of the dipoles 211 and 212 in the intensity distribution in the pupil IPU of the illumination system IL through parameters such as the reticle transmission, the transmission along the optical paths from illumination pupil IPU to the image MP' at wafer level, and the exposure time of each point in a target portion C. Due to the capability of the source SO to provide excess power, there is an amount or portion of integrated intensity available for providing assist poles 221 and 222 in accordance with the present invention.

By operating the source SO at an excess power such that an effective, preselected integrated intensity higher than the aforementioned target integrated intensity for printing the pattern MP' is obtained in the illumination system pupil IPU, assist poles 221 and 222 can be provided with an integrated intensity which is a portion of the preselected integrated intensity—this portion being complementary to the target integrated intensity.

In the present example of the embodiment, the assist poles 221 and 222 are shaped and dimensioned to have substantially the same integrated intensity as the target integrated intensity of the image forming dipole illumination mode (211, 212). Also, the intensity of any of the poles is chosen to be substantially uniform, both inside a single pole as well as over different poles. In accordance herewith, and with the radial extents of the assist poles 221 and 222 given by $\sigma_{2,\ inner}$=0.914 and $\sigma_{2,\ outer}$=0.98, the desired portion of integrated intensity for the assist poles 221 and 222 is obtained when the angular extent (indicated by arrow 223 in FIG. 4) of the assist poles 221 and 222 is selected to be 90 degrees.

According to the present invention, it is not necessary that the size and shape of the assist poles 221 and 222 be such that these poles have the same integrated intensity as the target integrated intensity of the image forming poles 211 and 212. The integrated intensity of the assist poles 221 and 222 may be lower than the integrated intensity of the image forming poles 211 and 212, or alternatively may be higher than the latter intensity. The ratio of the integrated intensity of the assist poles 221 and 222 to the integrated intensity of the image forming poles 211 and 212 (together with the total integrated intensity available for distribution over the assist poles and the image forming poles) determines the range of possible lay outs of the assist poles 221 and 222 in terms of radial and angular extent. The ratio can be chosen such that the angular extent 223 of the assist poles 221,222 remains sufficiently small so as to be effective to compensate astigmatism aberration. In the present embodiment, for example, assist poles 221,212 with large angular extent 223 approaching 180 degrees would be less effective for compensation of astigmatism aberration, due to the specific asymmetry of astigmatism aberration. Examples of possible choices for the ratio of the integrated intensity of the second set of poles, i.e., the assist poles 221 and 222, to the integrated intensity of the first set of poles 211 and 212 are values between 1.1 and 2 or between 0.5 and 0.9.

Figure 5:
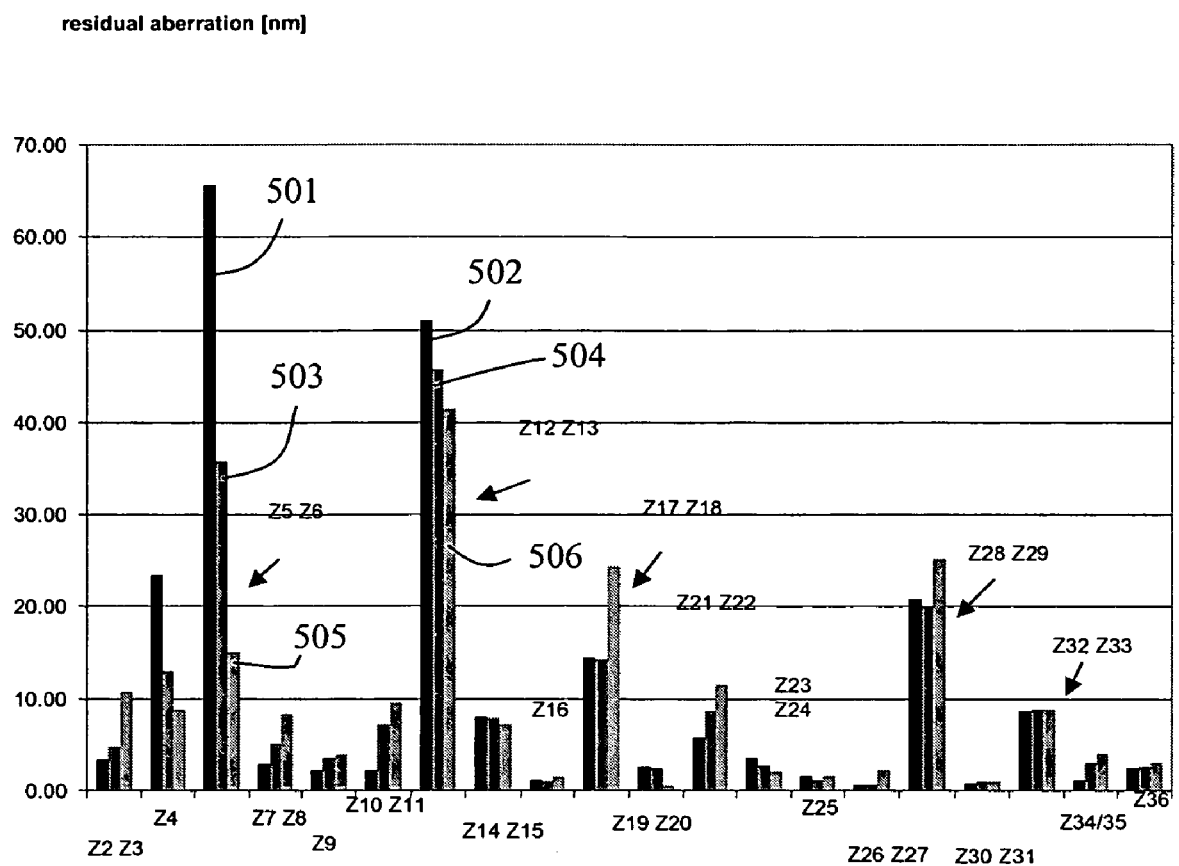
FIG. 5 depicts, along the vertical axis, the magnitude of specific Zernike aberrations as indicated along the horizontal axis, whereby the aberrations are due to lens heating for both a conventional lithographic apparatus and a lithographic apparatus arranged according to the present invention, when used for a lithographic printing process involving a dipole illumination mode.

FIG. 5 illustrates the effect of the assist poles 221 and 222 of the present example on the magnitude of third order and fifth order astigmatism aberration, as represented by the magnitude of the corresponding Zernike coefficients Z5, Z6, Z12 and Z13. Zernike coefficients weigh the presence of wave front phase error contributions, whereby the total wave front phase error is expressed as a sum of wave front error contributions. The wave front error contributions are expressed as a set of orthogonal Zernike polynomials P1, P2, and so on. For example, the polynomials P5, P6, P12 and P13 occurring at the weights Z5, Z6, Z12 and Z13, respectively, are characteristic for third and fifth order astigmatism, and are given by:

$P5 = \rho^2 \cos 2\theta$, $P6 = \rho^2 \sin 2\theta$, $P12 = (4\rho^4 - 3\rho^2)\cos 2\theta$, and $P13 = (4\rho^4 - 3\rho^2)\sin 2\theta$, where $\rho$ and $\theta$ are, like $\sigma$ and $\theta$, normalized polar coordinates in a plane comprising the pupil PPU of the projection system PS.

The effect on optical aberrations due to lens heating was calculated using computer simulation. Along the vertical axis in FIG. 5 is plotted the value of different Zernike coefficients, and along the horizontal axis, specific Zernike coefficients are identified. The bars 501 and 502 represent the values of, respectively, third-order and fifth-order astigmatism, for the lithographic printing process of the present example when performed in a conventional manner. The bars 503 and 504, by contrast, represent the corresponding aberrations, but in the presence of the lens heating that results from providing assist poles according to the present invention. FIG. 5 illustrates that the use of assist poles according to the present invention reduces the presence of third order astigmatism by a factor 1.8, and also fifth order astigmatism is reduced substantially.

In a second example of the present embodiment, which is the same as the first example except for the size and shape of the assist poles 221 and 222 and the setting of the numerical aperture value $NA_{sel}$ of the projection lens PL, a further reduction of astigmatism aberration is obtained. In the present example, the adjustable iris diaphragm serving as aperture device PD according to the present invention, is set at a numerical aperture $NA_{sel} = 0.78$, corresponding to $\sigma = 0.84$ at $NA_{max} = 0.93$. The size of the first set of poles 211 and 212 is the same as in the first example: $\sigma_{1, inner} = 0.59$ and $\sigma_{1, outer} = 0.81$, and the angular extent 213 of these poles is 35 degrees.

The assist poles 221,222 in this example, however, are provided with a radial extent of $\sigma_{2, inner} = 0.84$ and $\sigma_{2, outer} = 0.98$ and an angular extent 223 of 60 degrees. The bars 505 and 506 represent the value of third order and fifth order astigmatism in the presence of the lens heating that the assist poles 221 and 222 provide when deployed with the specifications mentioned here. FIG. 5 illustrates that with the use of these assist poles, the presence of third order astigmatism may be reduced by a factor 4, and fifth order astigmatism is reduced by a factor 1.2.

The present invention is not limited to a lithographic projection apparatus whereby the first and second set of two poles are disposed in corresponding first and second sets of opposite quadrants defined by two axes intersecting each other in the center of the pupil. Pupil sections different from quadrants, and each comprising either an assist pole or a pole, the radiation of which comprises a portion that traverses the mask pattern undiffracted and that irradiates the substrate, may be defined by two axes intersecting each other at an angle different from 90 degrees. For example, the angular size of the sections can be chosen according to the symmetry of the aberration which is to be reduced by the assist poles of the present invention, so that radiation provided by such assist poles includes a portion that traverses the mask pattern undiffracted and that is blocked from reaching the substrate by an aperture device.

According to an aspect of the present invention, the reduction of astigmatism aberration by the provision of assist poles is combined with a reduction and control of astigmatism aberrations as well as other aberrations obtained by adjustment of lens positions and orientations. For the latter adjustments, the projection system PS can be provided with lens actuators or lens manipulators.

Figure 6:
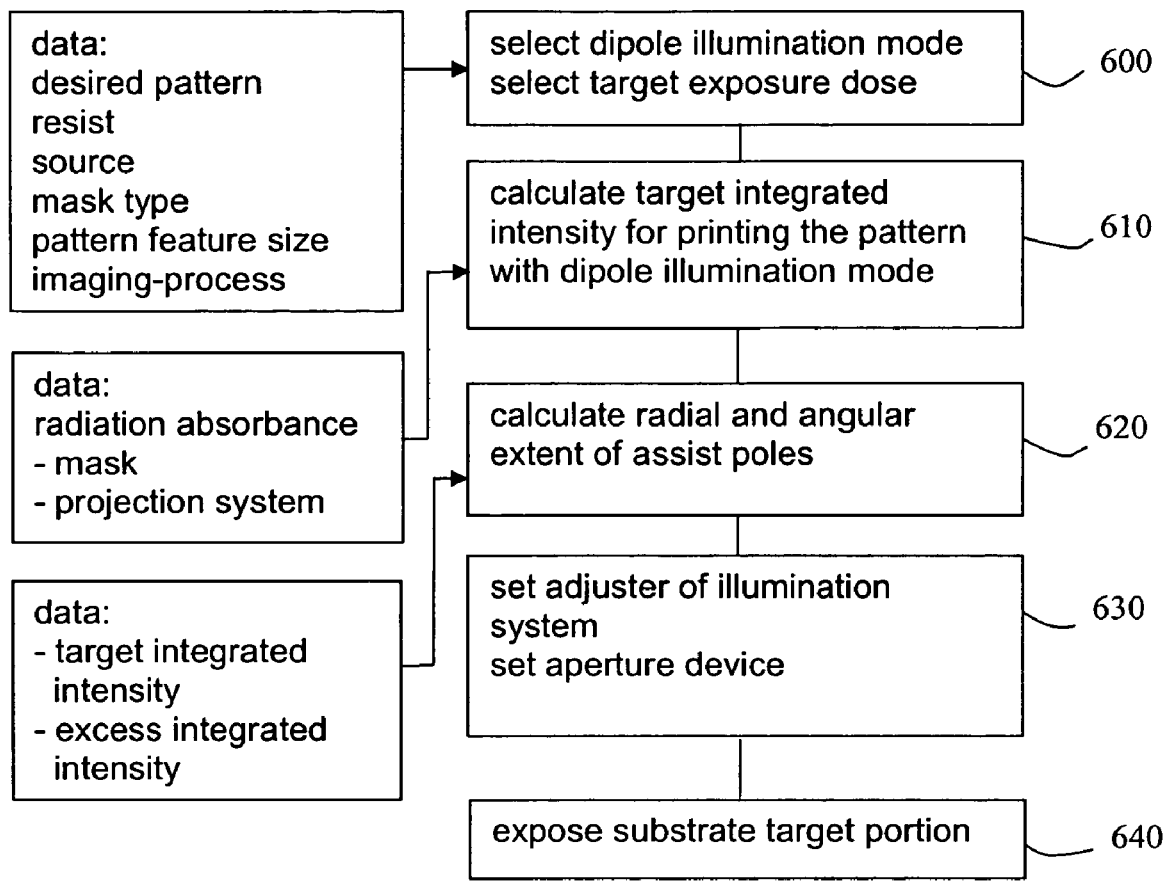
FIG. 6 depicts a flow diagram illustrating a method of manufacturing a device according to the present invention.

FIG. 6 illustrates a flow diagram representing a device manufacturing method according to the present invention. In step 600, a dipole illumination mode comprising poles 211 and 212 and a target exposure dose are selected in accordance with a desired pattern to be lithographically printed and based on data comprising resist data, source data, mask type data, pattern feature size data and apparatus imaging-process data. The latter data include, for example, numerical aperture data, and nominal aberration data. In step 610, a target integrated intensity for printing the pattern using the poles 211 and 212 is calculated, based on data that includes radiation absorbance data for the mask and the projection optical system.

In step 620, the radial and angular extent of two poles 221 and 222 (to be disposed in two opposite quadrants 241 and 242 in the pupil IPU of the illumination system IL and not including any of the two poles 211 and 212) is calculated based on data that includes a difference between the target integrated intensity and an excess integrated intensity available in accordance with excess power of the radiation source.

In step 630, the adjuster AD of the illumination system IL is set to provide the assist poles 221 and 222 in addition to the poles 211 and 212, and the aperture device PD is set to block zeroth order diffracted beams associated with the poles 221 and 222, and to transmit zeroth order diffracted beams associated with the poles 211 and 212. In step 640, the target portion C is exposed.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications.

The terms "radiation" and "beam" used herein encompass all types of electromagnetic radiation, including but not limited to ultraviolet (UV) radiation (e.g. having a wavelength of or about 365, 355, 248, 193, 157 or 126 nm) and extreme ultra-violet (EUV) radiation (e.g. having a wavelength in the range of 5-20 nm).

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic projection apparatus comprising:
   an illumination system configured to illuminate a mask pattern with radiation from an intensity distribution in a pupil, said pupil having four quadrants defined by two axes that intersect one another in a center of the pupil, said intensity distribution having a first pole located in one of said quadrants, a second pole located in one of said quadrants opposite to the quadrant in which said first pole is located, a third pole located in one of the quadrants that contains neither of said first or second poles, and a fourth pole located in the quadrant located opposite to the quadrant in which said third pole is located, each of said first, second, third, and fourth poles having an enhanced intensity with respect to an intensity surrounding said poles, and
   a projection system configured to project an image of the mask pattern, formed by diffracted beams produced from the pattern by radiation from the intensity distribution, onto a photoresist layer coated on a substrate, wherein the projection system comprises an aperture device arranged to transmit zeroth order diffracted beams associated with the first and second poles, and to block zeroth order diffracted beams associated with the third and fourth poles.

2. An apparatus according to claim 1, wherein relative to the center of the pupil, a minimum radial extent of the third and fourth poles is larger than or equal to a maximum radial extent of the first and second poles.

3. An apparatus according to claim 2, wherein said first, second, third and fourth poles are arranged so that:
   $\sigma_{2min}$ has a value in the range of 0.7 to 0.9 unit, and
   $\sigma_{1max}$ has a value in the range of 0.6 to 0.83 unit,
   where the radius of the pupil is equal to 1 unit, and
   $\sigma_{2min}$ is the shortest radial distance from the center of the pupil to the third and fourth poles, and
   $\sigma_{1max}$ is the farthest radial distance the first and second poles extend away from the center of the pupil.

4. An apparatus according to claim 1, wherein the aperture device comprises one of an iris diaphragm, an adjustable iris diaphragm, and an optical element comprising a spatial distribution of radiation absorbing sub-elements arranged to block zeroth order diffracted beams associated with the third and fourth poles.

5. An apparatus according to claim 2, wherein a radiation source arranged to provide the radiation to the illumination system, is capable of providing in the pupil a preselected integrated intensity higher than a target integrated intensity for printing the pattern, and wherein an integrated intensity of the third and fourth poles is arranged as a portion of the preselected integrated intensity, said portion being complementary to the target integrated intensity.

6. An apparatus according to claim 2, wherein a radiation source arranged to provide the radiation to the illumination system, is capable of providing in the pupil a pre-selected integrated intensity higher than a target integrated intensity for printing the pattern, and wherein the ratio of the integrated intensity of the third and fourth poles to the integrated intensity of the first and second poles is arranged to have a value between 1.1 and 2 or between 0.5 and 0.9.

7. An apparatus according to claim 1, wherein a radiation source arranged to provide the radiation to the illumination system, is capable of providing in the pupil a preselected integrated intensity higher than a target integrated intensity for printing the pattern, and wherein an integrated intensity of the third and fourth poles is arranged as a portion of the preselected integrated intensity, said portion being complementary to the target integrated intensity.

8. An apparatus according to claim 1, wherein a radiation source arranged to provide the radiation to the illumination system, is capable of providing in the pupil a pre-selected integrated intensity higher than a target integrated intensity for printing the pattern, and
wherein the ratio of the integrated intensity of the third and fourth poles to the integrated intensity of the first and second poles is arranged to have a value between 1.1 and 2 or between 0.5 and 0.9.

9. A device manufacturing method of using a lithographic projection apparatus for exposing a substrate, comprising:
   illuminating a mask pattern with radiation from an intensity distribution in a pupil, said pupil having four quadrants defined by two axes that intersect one another in a center of the pupil, said intensity distribution having a first pole located in one of said quadrants, a second pole located in one of said quadrants opposite to the quadrant in which said first pole is located, a third pole located in one of the quadrants that contains neither of said first or second poles, and a fourth pole located in the quadrant located opposite to the quadrant in which said third pole is located, each of said first, second, third, and fourth poles having an enhanced intensity with respect to an intensity surrounding said poles; and projecting an image of the mask pattern, formed by diffracted beams produced from the pattern by radiation from the intensity distribution, onto a photoresist layer coated on a substrate, wherein said projecting comprises transmitting zeroth order diffracted beams associated with the first and second poles, and blocking zeroth order diffracted beams associated with the third and fourth poles.

10. A method according to claim 9, wherein relative to the center a minimum radial extent of the third and fourth poles is larger than or equal to a maximum radial extent of the first and second poles.

11. A method according to claim 9, wherein said blocking of radiation is one of partially transmitting, diffracting, reflecting, and partially reflecting, absorbing and partially absorbing radiation.

* * * * *